United States Patent
Jerred (12)

(10) Patent No.: US 6,509,607 B1
(45) Date of Patent: Jan. 21, 2003

(54) SEMICONDUCTOR DEVICE WITH REDUCED SOURCE DIFFUSION DISTANCE AND METHOD OF MAKING SAME

(75) Inventor: Paul Antony Jerred, Manchester (GB)

(73) Assignee: Zetex PLC, Chadderton (GB)

( * ) Notice: Subject to any disclaimer, the term of this patent is extended or adjusted under 35 U.S.C. 154(b) by 0 days.

(21) Appl. No.: 09/505,808

(22) Filed: Feb. 17, 2000

(30) Foreign Application Priority Data

Feb. 18, 1999 (GB) ................................................ 9903594

(51) Int. Cl.$^7$ ............................................... H01L 29/76
(52) U.S. Cl. .................. 257/330; 257/329; 257/332; 257/333
(58) Field of Search ................................ 257/330, 329, 257/212, 133, 220, 242, 263, 302, 326, 332, 368, 333, 334, 335, 338; 438/339, 206, 212, 259

(56) References Cited

U.S. PATENT DOCUMENTS

| | | | | |
|---|---|---|---|---|
| 4,364,074 A | | 12/1982 | Garnache et al. ............. 357/23 |
| 4,523,369 A | * | 6/1985 | Nagakubo ............ 148/DIG. 85 |
| 4,929,987 A | | 5/1990 | Einthoven .................... 347/234 |
| 4,983,535 A | | 1/1991 | Blanchard .................... 437/40 |
| 5,086,007 A | | 2/1992 | Ueno ............................. 437/41 |
| 5,576,245 A | | 11/1996 | Cogan et al. ................ 437/203 |
| 5,629,543 A | * | 5/1997 | Hshieh ........................ 257/330 |
| 5,656,842 A | | 8/1997 | Iwamatsu et al. ............ 257/329 |
| 5,691,555 A | * | 11/1997 | Zambrano .................... 257/332 |
| 5,701,026 A | | 12/1997 | Fujishima et al. ........... 257/510 |
| 5,723,891 A | * | 3/1998 | Malhi ........................... 257/341 |
| 5,801,408 A | * | 9/1998 | Takahashi .................... 257/212 |
| 6,084,264 A | * | 7/2000 | Darwish ...................... 257/329 |

FOREIGN PATENT DOCUMENTS

JP          406151867 A   *   5/1994

* cited by examiner

*Primary Examiner*—Phat X. Cao
*Assistant Examiner*—Nathan W. Ha
(74) *Attorney, Agent, or Firm*—Foley & Lardner

(57) ABSTRACT

A semiconductor device comprising a drain region, a body region overlying the drain region and defining an upper surface, source regions extending from adjacent the upper surface of the body region towards the drain region, and a series of indentations extending into and through the body region such that lower side walls of each indentation are defined by portions of the body and drain regions and upper side walls of each indentation are defined by the source region. A lower portion of each indentation is filled with a gate region isolated from the side walls by a first insulating layer and covered by a second insulating layer. A source conductor overlies the upper surface and is electrically connected to the source regions, and a gate conductor is electrically connected to each gate region. The source conductor extends into all upper portion of each indentation to contact portions of the upper side Walls of the indentation which are defined by the source regions.

14 Claims, 7 Drawing Sheets

SEMICONDUCTOR DEVICE WITH REDUCED SOURCE DIFFUSION DISTANCE AND METHOD OF MAKING SAME

BACKGROUND OF THE INVENTION

1. Field of the Invention

The present invention relates to a semiconductor device and in particular to a semiconductor device having a structure suitable for the formation of a vertical channel MOS power transistor.

U.S. Pat. No. 5034785 describes the evolution of double diffused MOS transistors. FIG. 1 of the U.S. patent illustrates an early structure in which in an on-state a field from a gate forms a horizontal conducting chattel, allowing current to flow laterally beneath the gate. After flowing laterally, the current must then flow vertically to reach a drain region. FIG. 2 of the above US patent illustrates an alternative structure generally referred to as a UMOS structure. In that structure, source, body and drain regions are arranged vertically adjacent a trench fondled in a wafer surface, the trench being generally of U-shaped cross-section. Current thus flows more efficiently in the vertical direction only. The structure of FIG. 2 of the above US patent is however difficult to fabricate as it requires the formation of a U-shaped gate lining the sides of the trench and results in a transistor with a non-planar surface. FIG. 3 of the above US patent seeks to provide a UMOS structure which is not subject to these disadvantages by providing a vertical gate in a structure with a planar surface whilst still enabling contact to be made to the gate which is embedded beneath that surface.

2. Description of the Prior Art

In the known structure as illustrated in FIG. 3 of the above US patent, a drain region is overlaid by a body region which defines a substantially planar upper surface. Source regions extend from the upper surface towards the drain region and a series of indentations extend from the upper surface of the body region. The indentations are arranged such that lower side walls of each indentation are defined by portions of the drain and body regions and upper side walls of each indentation are defined by source regions. A lower portion of each indentation is filled with a gate region isolated from the side walls of the indentation by a first insulating layer and covered by a second insulating layer. The indentations are completely filled with the material malting up the gate region and the first and second insulating layers. A source conductor overlies the upper surface of the body region to contact portions of the source regions which are substantially coplanar with the upper surface of the body region. Thus with such an arrangement the resultant device has a flat upper surface.

It is of course desirable to produce power transistors with a relatively low on state resistance for a given lateral area. Accordingly it is desirable to minimise the spacing between adjacent gate and source structures. The known structure described in FIG. 3 of the above US patent does impose certain dimensional limitations however. Firstly, a minimum lateral spacing must be provided between adjacent source regions such that an adequate suppression of carrier injection from the emitter-base junction of the parasitic (source/body/drain) bipolar element is achieved. For each source region, this requires an adequate low resistance path from the overlying source conductor, through the body region, to the point on the boundary of the source region most distant from the overlying source conductor. A further limitation arises in that the lateral width of each source region at the upper surface must be sufficient to provide a contact area between the source region and the source conductor capable of caring the required current Thus the minimum spacing that must be provided between the closest adjacent side walls of two indentations is the sum of the minimum inter-source spacing necessary to provide adequate inhibition of unwanted bipolar conduction and twice the minimum lateral source width for acceptable contact resistance.

SUMMARY OF THE DISCLOSURE

It is an object of the present invention to provide a semiconductor structure in which the minimum spacing between adjacent gate regions can be reduced beyond the above-described dimensional limitations According to the present invention, there is provided a semiconductor device comprising a drain region, a body region overlying the drain region and defining an upper surface, source regions extending from adjacent the upper surface of the body region towards the drain region, and a series of indentations extending into the body region such that lower side walls of each indentation are defined by portions of the drain and body regions and upper side walls of each indentation are defined by the source regions, wherein a lower portion of each indentation is filled with a gate region isolated from the side walls by a first insulating layer and covered by a second insulating layer, a source conductor overlies the upper surface and is electrically connected to the source and body regions, and a gate conductor is electrically connected to each gate region, the source conductor extending into an upper portion of each indentation to contact portions of the upper side walls of the indentation which are defined by the source regions.

The present invention also provides a method for forming a semiconductor as defined in tile preceding paragraph, wherein indentations are formed in a semiconductor wafer, lined with a first insulating layer, and partially filled with a gate material such that lower side walls of each indentation adjacent the gate material are defined by portions of a body region and a drain region and upper side walls of each indentation above the gate material are defined by portions of source regions, a second insulating layer is formed in each indentation to cover the gate region, tile second insulating layer is etched back to a depth such that portions of the upper side walls defined by the source regions are exposed above the second insulating layer, and an electrically conductive layer is deposited on the wafer so as to extend into each indentation and contact the exposed upper side walls defined by the source regions.

Preferably the upper surface of the body region is substantially planar and the source regions define upper surfaces which are substantially coplanar with the upper surface of the body region, the source conductor overlying and electrically contacting the upper surfaces of the source regions.

Given that the source conductor extends into the indentations and contacts surfaces of the source regions which define side walls of the indentations, the total area of contact between the source regions and the source conductor is a function of the width of the portion of each source region which is coplanar with the upper surface of the body region plus the depth of penetration of the source conductor into the upper portion of the indentations. For a given required area of source/source conductor contact. the minimum acceptable dimension of the source regions in the direction separating adjacent gate regions can be reduced as compared with structures in which no source/source conductor contact is made within upper portions of the indentations.

A further advantage which can be realised with the present invention is that the source diffusion distance can be smaller than in prior art devices. This is because in prior art devices the source is contacted by the source conductor only on the upper surface of the device, the area of contact being proportional to the diffusion distance assuming that the source is formed by diffusion from the indentation walls. In contrast, with the present invention, the source is contacted by the source conductor within the indentation and it is not therefore necessary to have a relatively large source diffusion distance to achieve an adequate lateral contact width. Given that relatively small source diffusion distances can be used, very accurate channel width definition is possible using very accurate techniques such as rapid thermal annealing Manufacturing tolerances with regard to the channel width, necessary to accommodate variations in source diffusion distance, can be very much reduced.

BRIEF DESCRIPTION OF THE DRAWINGS

Embodiments of the present invention will now be described, by way of example, with reference to the accompanying drawings, in which.

DESCRIPTION OF THE PREFERRED EMBODIMENT

Figure 1:
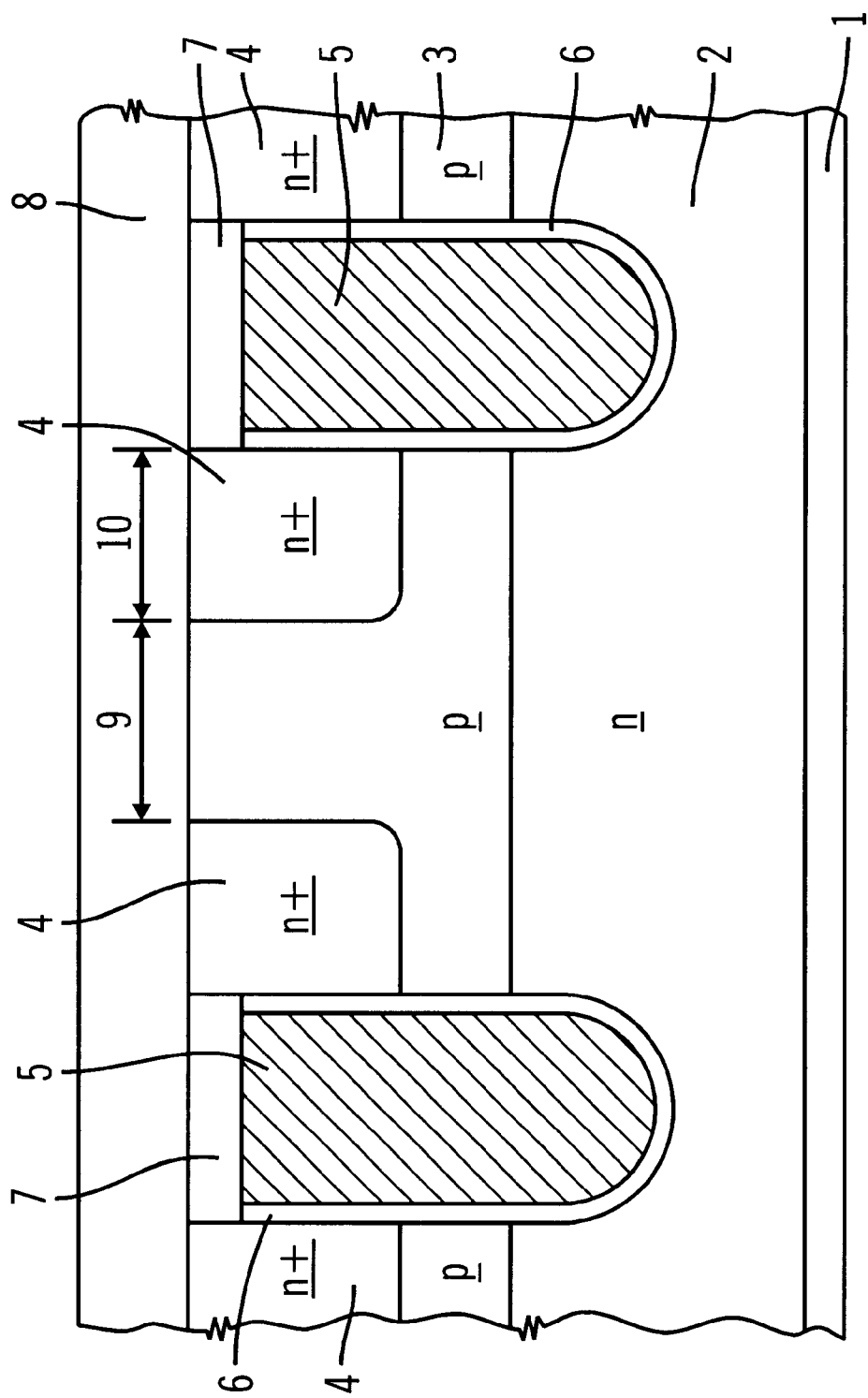
FIG. 1 is a schematic cross-section through a conventional UMOS structure.

Referring to FIG. 1, the illustrated prior art structure comprises a series of trenches which form indentations extending in a direction perpendicular to the plane of FIG. 1. Each trench structure overlies an n+ type semiconductor drain region 1, an n− type drain region 2, and a p-type body region 3. Each trench structure comprises n+ source regions 4, a gate region 5 isolated from the body and source regions by a first insulating layer 6, and a second insulating layer 7.

As illustrated, the insulating layer 6 extends only to the top of the gate region 5, but it will be appreciated that the layer 6 may extend to the top of the layer 7. A source-contacting conductor 8 extends over the substantially planar surface defined by the upper surfaces of the body region 3, source reunions 4 and insulating layers 7. Thus each gate region 5 and adjacent insulating layers 6 and 7 completely fill an indentation formed in the semiconductor structure, the side walls of the indentation corresponding in position to the boundary between the first insulating layer 6 and the drain region 2, the body region 3 and source regions 4, and the boundary between the second insulating layer 7 and source regions 4.

The illustrated device can be turned on to cause current to flow between the source regions 4 and the drain region 1 by applying appropriate potentials to the source, drain and gate so as to establish a conducting channel region through the body region 3 adjacent the gate region 5. The operational characteristics of the structure are entirely conventional and will not be further described herein.

The minimum spacing between the indentations of adjacent trench structures is the sum of the spacing between adjacent source regions 4 (indicated by arrow 9 in FIG. 1) and twice ale width of the source regions 4 (indicated by arrow 10 in FIG. 1). The inter-source spacing must be sufficient to ensure adequate inhibition to n-p-n bipolar turn-on, and typically is 1 μm. The source width must be sufficient to carry an adequate current to the source regions and typically is also 1 μm. Thus a minimum inter-indentation spacing is typically 3 μm.

Figure 2:
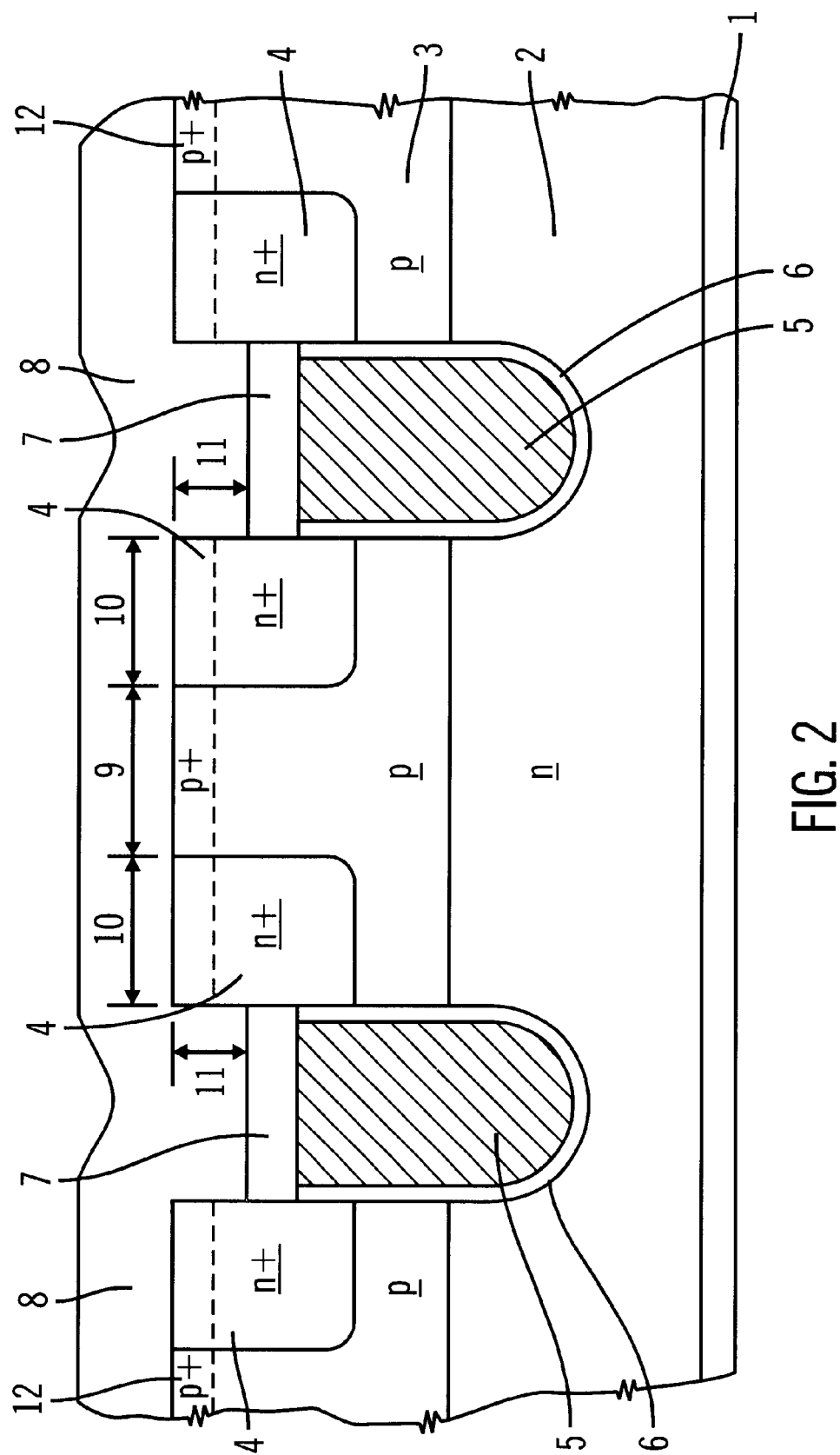
FIG. 2 is a schematic cross-section through a structure in accordance with the present invention.

Referring to FIG. 2, this shows an embodiment of the present invention. The same numerals are used for equivalent structures in FIGS. 1 and 2. The difference between the two illustrated structures is that in FIG. 1 the upper surface of the insulating layer 7 is coplanar with the coplanar upper surfaces of the body region 3 and source regions 4 and is therefore coplanar with the lower surface of the source conductor 8, whereas in the arrangement of FIG. 2 the upper surface of the insulating layer 7 is recessed such that the conductor layer 8 penetrates into the upper portion of the indentations to a depth indicated by arrow 11. Thus the contact area between the conductor layer 8 and each source region 4 is a function of the sum of the dimensions indicated by arrows 10 and 11. Accordingly, for a dimension 11 of 0.6 μm, the dimensions 10 can be relatively small, for example 0.4 μm rather than 1 μm, resulting in a minimum spacing between adjacent indentations of 1.8 μm rather than 3 μm.

As shown in FIG. 2, an unpatterned p+ surface dopant concentration enhancement region 12 may be introduced orthogonal to the upper surface of the body region 3 and source regions 4 without increasing the source contact resistance to an unacceptable extent given that the source conductor 8 contacts the sources 4 via the side walls of the indentations above the upper surface of the insulating layer 7. The surface dopant concentration enhancement region does not penetrate to a significant extent into the side walls of the indentations defined by the source regions 4.

Figure 3:
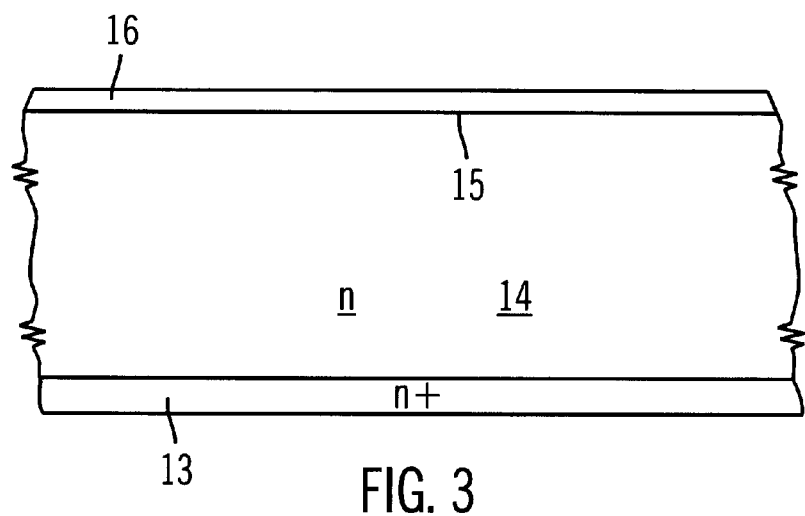
FIG. 3 is a schematic illustration of a cross-section of a part of a semiconductor body covered by a mask in an initial step in a process to form a structure such as that illustrated in FIG. 2.
Figure 4:
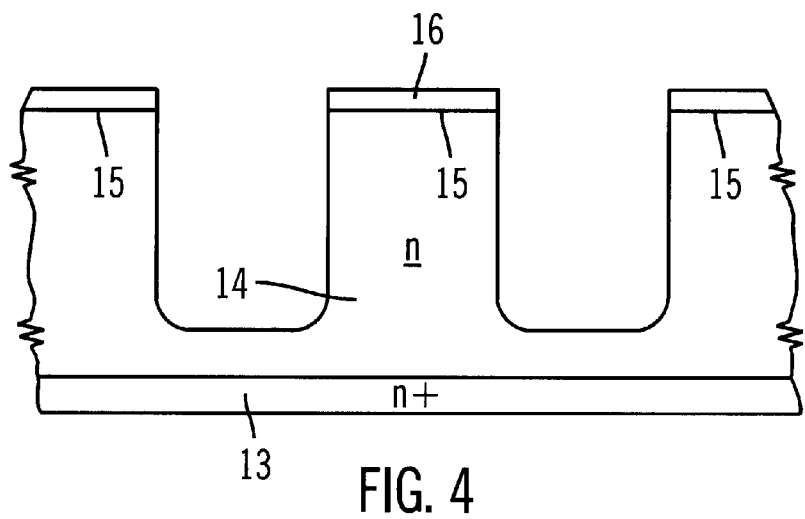
FIG. 4 is a schematic illustration of the cross-section of FIG. 3 after trenches have been etched into the semiconductor body.

Referring now to FIGS. 3 to 12, the fabrication of a structure such as that illustrated in FIG. 2 will now be described. Referring to FIG. 3, a semiconductor body is formed on a substrate defining an n+ type semiconductor drain region 13. The semiconductor body comprises an n− type drain region 14, extending to an upper surface 15, which supports a masking layer 16 which may be selectively removed by etching to define areas where trenches are to be formed in the region 14. The drain region 14 may be an epitaxial layer. The masking layer 16 may comprise a single material type, for example silicon dioxide, or it may be a multi-layer comprising several different materials, for example silicon dioxide/silicon nitride/silicon dioxide. After selective removal of the mask 16, trenches are etched to a predetermined depth through the exposed surface 15 and into region 14, as shown in FIG. 4, using a known method, for example reactive ion etching.

Typically, the illustrated multi-layer structure will be formed on a wafer substrate which might be 600 $\mu$m thick. The substrate in effect foils the drain region 13 of FIG. 3. The layers 14 and 16 built up on the substrate will be very much thinner than the substrate itself. For example, the region 14 may be 6 $\mu$m thick. The layer 13 is shown in the Figures as being relatively thin simply for the purposes of illustration.

Figure 5:
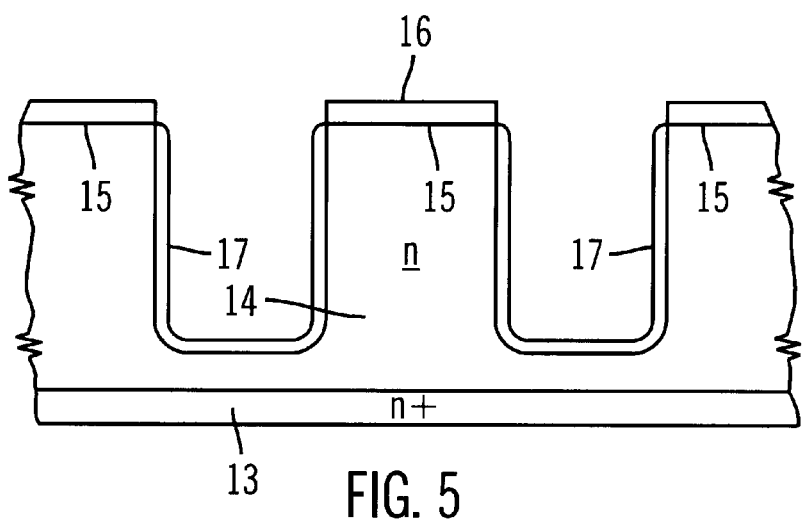
FIG. 5 is a schematic illustration of the cross-section of FIG. 4 after the trenches have been coated with oxide material.
Figure 6:
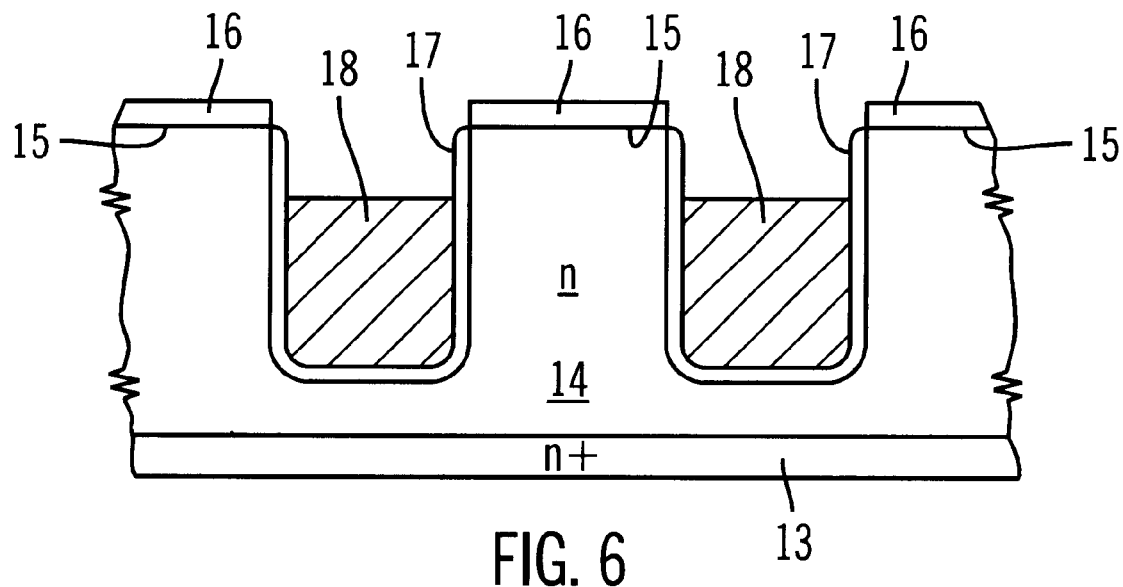
FIG. 6 is a schematic illustration of the cross-section of FIG. 5 after the trenches have been partially filled with polysilicon

An insulating oxide layer 17 is formed on the trench walls using a know technique as shown in FIG. 5. One such known technique is thermal oxidation. Layer 17 may also be formed as a composite oxide/nitride layer. Following layer 17 formation, a gate material 18 such as polysilicon is introduced into the trenches, for example using a low pressure chemical vapour deposition technique. The polysilicon gate material 18 is arranged to partially fill the trenches, as shown in FIG. 6, for example by first filling the trenches and then etching back some of the polysilicon 18. The polysilicon 18 may be doped to effect an improvement in conductivity. This may be done during or after deposition. In an alternative method, aluminium gates may be arranged partially to fill the trenches, without requiring to be etched back, using a method described in WO 9700536.

Figure 7:
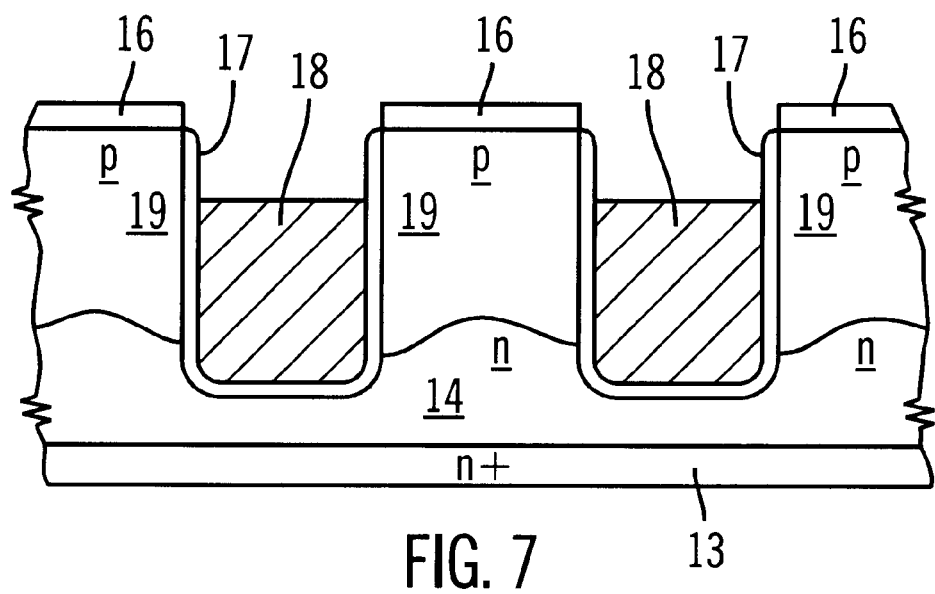
FIG. 7 is a schematic illustration of the cross-section of FIG. 6 after the semiconductor body has been doped with p-type dopant.

Referring to FIG. 7, p-type body dopant is introduced laterally into region 14 through the side walls of the trenches, and is then diffused to form p-type body regions 19. The body dopant may be introduced into the trench side walls using charged dopant ions (for example ionic boron) which pass directly through the oxide layer 17 and into the region 14. Alternatively, other known methods of dopant introduction may be used, for example gaseous predeposition. Some methods may require that the oxide layer 17 is first removed from the walls of the trenches above the gate material. FIG. 7 however illustrates a method in which the layer 17 remains intact.

Figure 8:
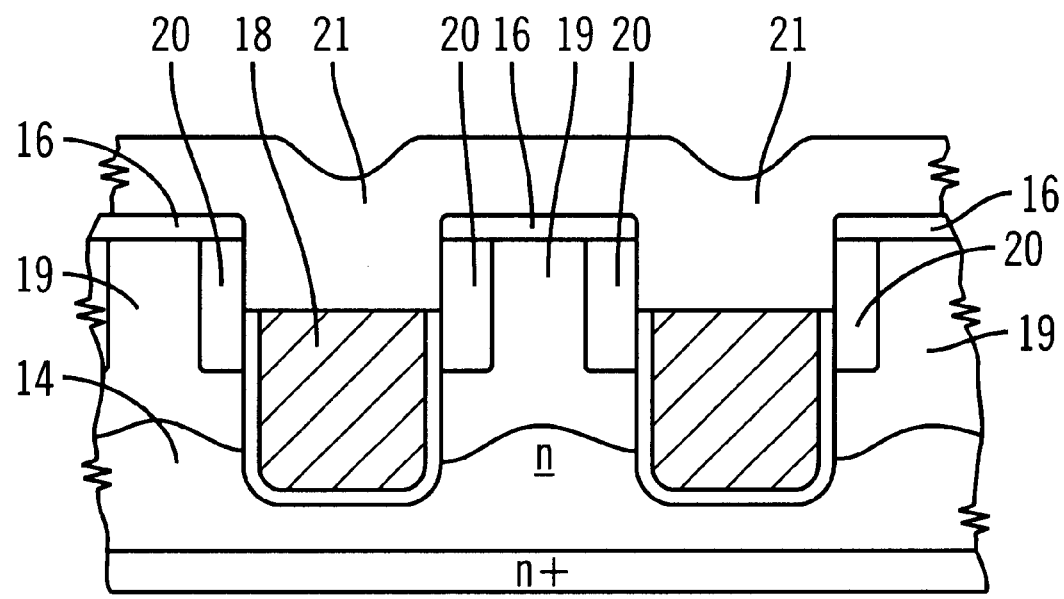
FIG. 8 is a schematic illustration of the cross-section of FIG. 7 after deposition of an isolation layer.

Referring now to FIG. 8, the portion of the layer 17 above the gate region 18 is removed, and then source dopant is introduced laterally through the side walls of the trenches, using a technique such as one of those described above, to form source regions 20. The source dopant is prevented from entering at least pail of the upper surface of the substrate by those portions of the trench masking layer 16 which have not been removed. It will be appreciated that although in the method described above the portions of the latter 17 above the gate region 18 are removed before source dopant introduction, dopant could be implanted through the layer 17 above the gate region 18. The diffusion of the source dopant is arranged such that it penetrates to a lesser distance than the body dopant, so that a portion of body region 19 is interposed between each source region 20 and drain region 14. The penetration distance of the source dopant must be closely controlled in order that the resultant channel width (that is the position of the boundary between the regions 19 and 20 relative to the position of the upper surface of each gate region 18) is accurately determined. It will be appreciated that driving in the source regions 20 will cause some further diffusion of the dopant forming the body regions 19, and that this further diffusion must also be taken into account when determining the desired relative positions of the source and body region boundaries.

The present invention allows for a minimal source diffusion distance, by eliminating the requirement for a wide lateral source contact width at the surface 15, such a wide lateral source contact being required in prior art devices in which the only contact with a source conductor is at the surface 15. Consequently, the vertical thickness of the portion of body region 19 interposed between a source region 20 and the drain region 14, known as the channel width, is more accurately determined.

Figure 9:
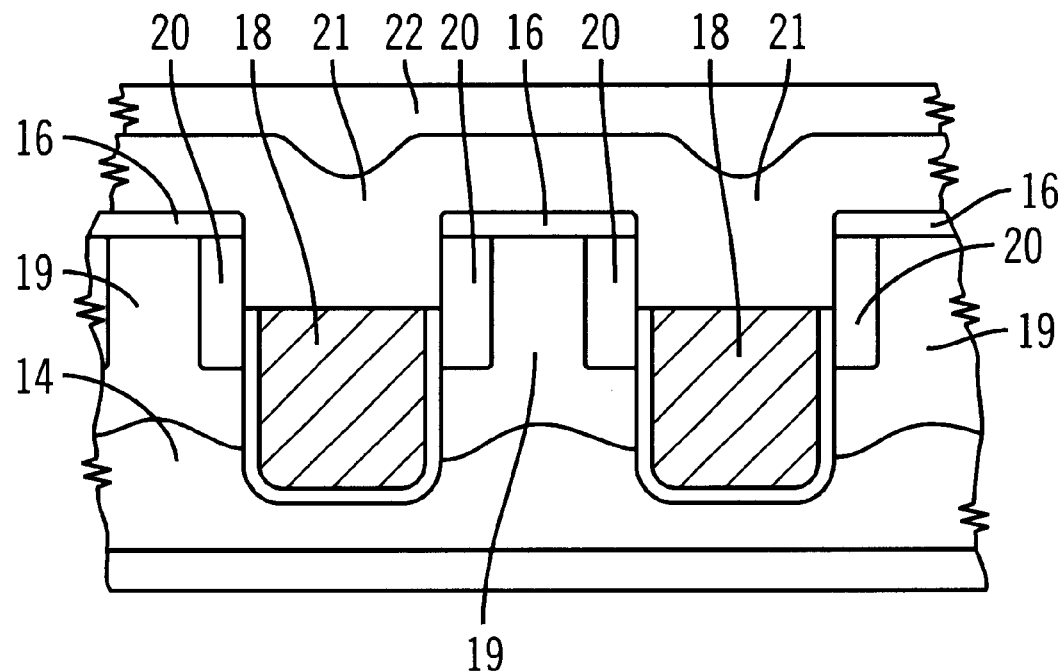
FIG. 9 is a schematic illustration of the cross-section of FIG. 8 after deposition of a planarising layer of photo-resist.
Figure 10:
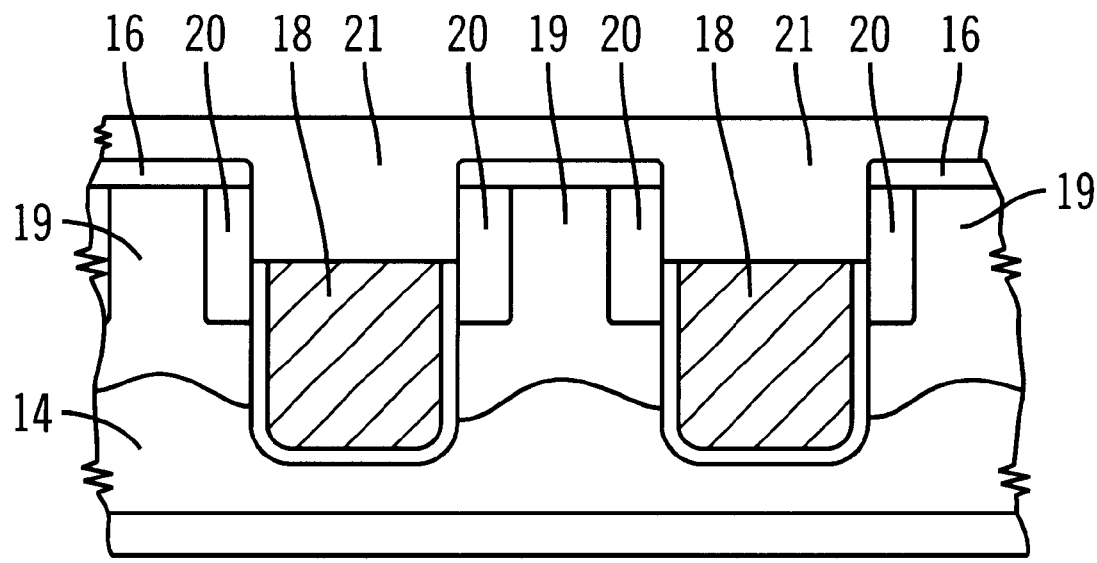
FIG. 10 is a schematic illustration of the cross-section of FIG. 9 after partially etching back the upper surface.

An isolation material 21 such as TEOS- or silane-based silicon dioxide is then deposited on the structure. The top surface of this layer 21 may then be planarised, using for example a layer 22 of photoresist, as shown in FIG. 9. The layer of photoresist 22 is spun onto the wafer and then balled to leave a substantially flat top surface. The structure of FIG. 9 is then subjected to a partial etch-back using an etch with 1:1 selectivity between layers 21 and 22, which leaves a new top surface of layer 21 substantially flat as shown in FIG. 10. A second etch-back is then carried out, this time with 1:1 selectivity between layer 21 and 16, to arrive at the intermediate structure of FIG. 11.

Figure 11:
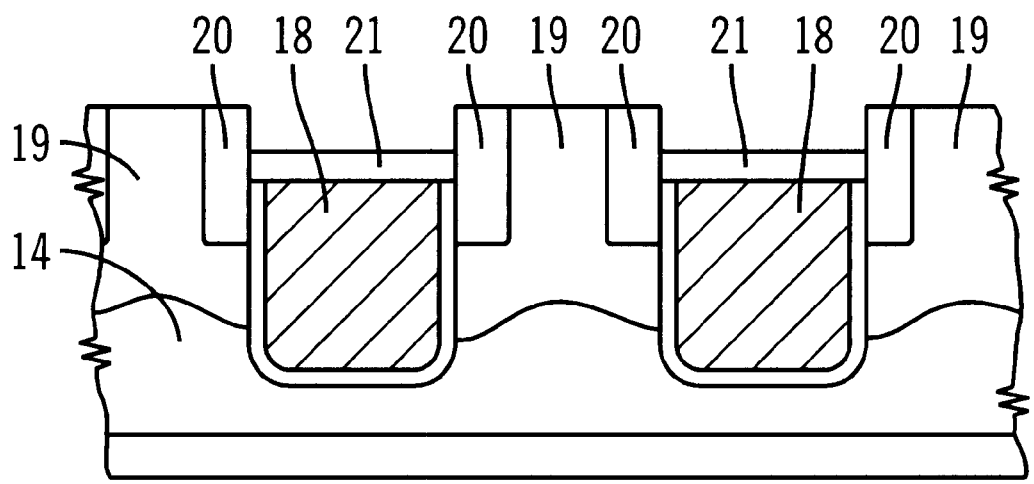
FIG. 11 is a schematic illustration of the cross-section of FIG. 10 after a further etch-back.

The etch-back which results in the structure of FIG. 11 will have a high selectivity between layers 21 and 16 (both for example of silicon dioxide) and regions 19 and 20 (both silicon). During this step the layer 16 is completely removed, exposing the substantially planar silicon surface below, and the layer 21 is substantially recessed below that planar surface.

A shallow p-type implant may additionally be carried out at this point, in order to boost the surface dopant concentration of p-type regions 19 (such an implant is not shown in FIG. 11).

Figure 12:
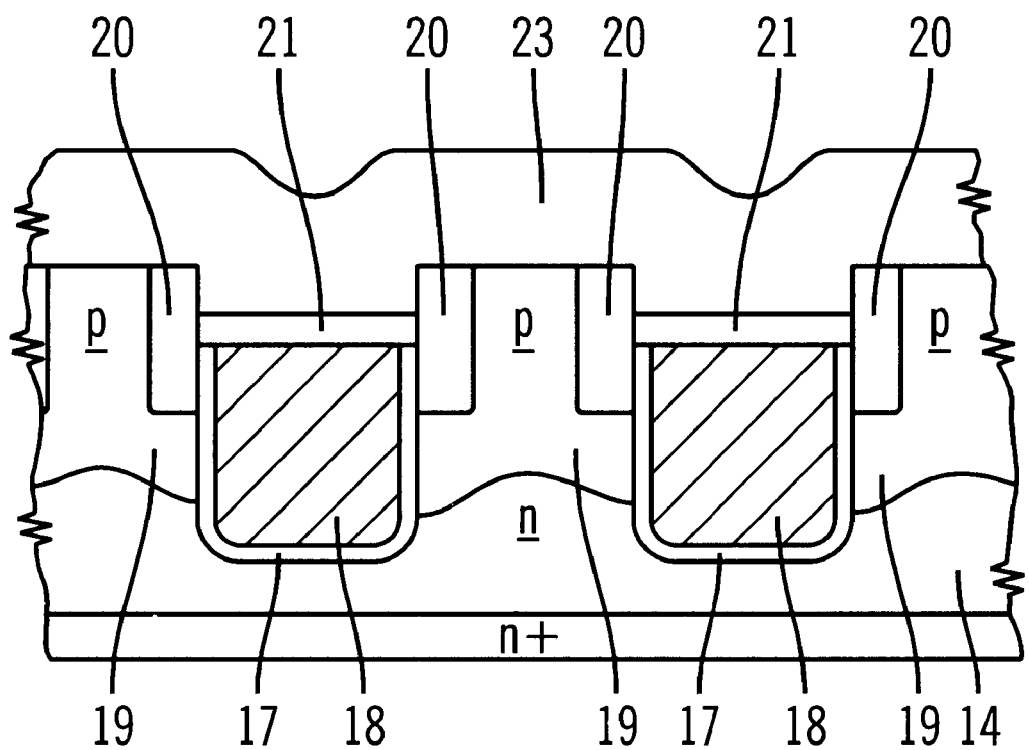
FIG. 12 is a schematic illustration of the cross-section of FIG. 1 after deposition of a source conductor to form an n-channel (n-p-n) UMOS device according to the invention.

A layer of metal 23 is then added to the upper surface of the structure, to form an electrical contact to the source regions 20 and body regions 19, as shown in FIG. 12. The gate regions 18 will be connected elsewhere to a gate contact metallisation region.

It is important to note that recessing the layer 21 below the top surface of the silicon as shown allows for an increased area of contact between source regions 20 and metal layer 23.

In an alternative embodiment, a p-type body region is present in the structure in the form of a layer of uniform thickness before the trenches are etched, that is at the stage shown in FIG. 3, This p-type body region would therefore be present at each of the stages shown in FIGS. 3, 4, 5 and 6. Lateral introduction of p-type dopant through the trench side walls is not then necessary at the stage shown by FIG. 7. The cross-sections at each of the stages shown in FIGS. 8, 9, 10, 11 and 12 would show a straight horizontal rather than curved boundary between layers 19 and 14 between the trenches. The completed structure would have the cross-section shown in FIG. 2 rather than that shown in FIG. 12.

In any of the above embodiments p and n type regions may be interchanged throughout to arrive at a p-channel (p-n-p) rather than n-channel (n-p-n) structure.

In any of the above embodiments, an additional layer beneath layer 13 and of opposite type to layer 13 may be present, resulting in the formation of a n-channel or p-channel IGBT structure. FIGS. 3 to 12 illustrate the formation of a device comprising two adjacent parallel trenches. It will be appreciated that the present invention may be used with a wide variety of trench configurations, for example the formation of a hexagonal array in which trenches are etched in spaces defined between a tightly packed array of hexagonal mesa areas on the surface of a substrate, or an array in which trenches are etched in spaces defined between regularly spaced square mesa areas arranged in rows with the mesa areas of adjacent rows offset by half the pitch of mesa areas in each row.

What is claimed is:

1. A semiconductor device comprising a drain region, a body region overlying the drain region and defining an upper surface, source regions extending from adjacent the upper surface of the body region towards the drain region, and a series of indentations having side walls extending into and through the body region in a direction substantially perpendicular to the upper surface defined by the body region such that lower portions of the side walls of each indentation are defined by portions of the body and drain regions and upper portions of the side walls of each indentation are defined by the source regions, wherein a lower portion of each indentation is filled with a gate region isolated from the side walls by a first insulating layer and covered by a second insulating layer, a source conductor overlies the upper surface and is electrically connected to the source regions, and a gate conductor is electrically connected to each gate region, the source conductor extending into an upper portion of each indentation to contact portions of the upper portions of the side walls of the indentation which are defined by the source regions.

2. A device according to claim 1, wherein the upper surface of the body region is substantially planar and the source regions define upper surfaces which are substantially coplanar with the upper surface of the body region, the source conductor overlying and electrically contacting the upper surfaces of the source regions.

3. A device according to claim 2, wherein the upper surface of each source region has a width of less than 1 $\mu$m.

4. A device according to claim 3, wherein the upper surface of each source region leas a width of 0.4 $\mu$m.

5. A device according to claim 1, wherein the portions of the upper portions of the side walls of each indentation which are defined by the source regions and are contacted by the source conductor have a depth of 0.6 $\mu$m.

6. A device according to claim 1, wherein the upper surface of the body region incorporates a surface dopant concentration enhancement region.

7. A device according to claim 1, wherein the drain region is of n type conductivity, the body region is of p type conductivity, and the source regions are of n+ type conductivity.

8. A method for forming a semiconductor device according to claim 1, wherein indentations are formed in a surface of a semiconductor wafer such that the indentations have side walls extending in a substantially perpendicular direction from the surface, and are lined with a first insulating layer, and partially filled with a gate material such that lower portions of the side walls of each indentation adjacent the gate material are defined by portions of a body region and a drain region and upper portions of the side walls of each indentation above the gate material are defined by portions of source regions, a second insulating layer is formed in each indentation to cover the gate region, the second insulating layer is etched back to a depth such that portions of the upper portions of the side walls defined by the source regions are exposed above the second insulating layer, and an electrically conductive layer is deposited on the wafer so as to extend into each indentation and contact the exposed upper portions of the side walls defined by the source regions.

9. A method according to claim 8, wherein the second insulating layer is formed so as to fill each indentation above the gate material and to cover the upper surface of the wafer, the upper surface of the second insulating layer is planarised, and the planarised second insulating layer is etched back into the indentations.

10. A method according to claim 9, Wherein the second insulating layer is planarised by applying a further layer thereto such that the further layer has a planar upper surface, and then etching the resultant structure using an etchant which removes the material of the second insulating layer and the further layer at the same rate.

11. A device according to claim 1, wherein the source conductor has a generally planar surface that extends into an upper portion of each indentation, and contacts each source region on a generally planar surface of said source regions, whereby the resulting contact surface between said generally planar surfaces defines said upper portions of the side walls of each indentation.

12. A device according to claim 11 wherein the upper portions of the side-walls of each indentation are generally coplanar to the lower portions of the side-walls of said indentation.

13. A device according to claim 1, wherein each source region has a side surface defining the upper portions of the side wall of an indentation and an upper surface, whereby said source conductor extends into an upper portion of each indentation and contacts both the side surface and upper surface of each source region.

14. A device according to claim 1, wherein an upper surface defined by the gate region is substantially parallel to the upper surface defined by the body region.

* * * * *